(12) United States Patent
Luan (10) Patent No.: US 12,494,447 B2
(45) Date of Patent: Dec. 9, 2025

(54) LOW COST WAFER LEVEL PACKAGES AND SILICON

(71) Applicant: STMicroelectronics Pte Ltd, Singapore (SG)

(72) Inventor: Jing-En Luan, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 598 days.

(21) Appl. No.: 17/860,491

(22) Filed: Jul. 8, 2022

(65) Prior Publication Data

US 2023/0032887 A1 Feb. 2, 2023

Related U.S. Application Data

(60) Provisional application No. 63/203,539, filed on Jul. 27, 2021.

(51) Int. Cl.
*H01L 23/00* (2006.01)
*H01L 21/56* (2006.01)
(Continued)

(52) U.S. Cl.
CPC .............. *H01L 24/19* (2013.01); *H01L 21/56* (2013.01); *H01L 24/06* (2013.01); *H01L 24/16* (2013.01);
(Continued)

(58) Field of Classification Search
CPC ......... H01L 24/19; H01L 24/06; H01L 24/16; H01L 24/20; H01L 24/24; H01L 24/73;
(Continued)

(56) References Cited

U.S. PATENT DOCUMENTS 7,101,731 B2  9/2006  Karnezos
7,420,274 B2  9/2008  Huang
(Continued)

FOREIGN PATENT DOCUMENTS

WO    2017160231 A1    9/2017
WO    2018125254 A1    7/2018

OTHER PUBLICATIONS

Fischer, Andreas C., et al: "Integrating MEMS and ICs," Microsystems & Nanoengineering, May 28, 2015, 57 pages.
(Continued)

*Primary Examiner* — Marlon T Fletcher
*Assistant Examiner* — Christina A Sylvia
(74) *Attorney, Agent, or Firm* — Crowe & Dunlevy LLC (57) ABSTRACT

Described herein is a method of forming wafer-level packages from a wafer. The method includes adhesively attaching front sides of first integrated circuits within the wafer to back sides of second integrated circuits such that pads on the front sides of the first integrated circuits and pads on front sides of the second integrated circuits are exposed. The method further includes forming a laser direct structuring (LDS) activatable layer over the front sides of the first integrated circuits and the second integrated circuits and over edges of the second integrated circuits, and forming desired patterns of structured areas within the LDS activatable layer. The method additionally includes metallizing the desired patterns of structured areas to form conductive areas within the LDS activatable layer.

21 Claims, 11 Drawing Sheets

(51) Int. Cl.
*H01L 25/065* (2023.01)
*H01L 25/16* (2023.01)

(52) U.S. Cl.
CPC .............. *H01L 24/20* (2013.01); *H01L 24/24* (2013.01); *H01L 24/73* (2013.01); *H01L 24/94* (2013.01); *H01L 24/97* (2013.01); *H01L 25/0652* (2013.01); *H01L 25/0657* (2013.01); *H01L 25/16* (2013.01); *H01L 24/05* (2013.01); *H01L 24/13* (2013.01); *H01L 24/32* (2013.01); *H01L 2224/05548* (2013.01); *H01L 2224/05571* (2013.01); *H01L 2224/06181* (2013.01); *H01L 2224/13024* (2013.01); *H01L 2224/16145* (2013.01); *H01L 2224/19* (2013.01); *H01L 2224/211* (2013.01); *H01L 2224/215* (2013.01); *H01L 2224/24105* (2013.01); *H01L 2224/24146* (2013.01); *H01L 2224/32145* (2013.01); *H01L 2224/73204* (2013.01); *H01L 2224/73267* (2013.01); *H01L 2224/9202* (2013.01); *H01L 2224/92125* (2013.01); *H01L 2224/92143* (2013.01); *H01L 2224/94* (2013.01); *H01L 2224/97* (2013.01); *H01L 2225/06524* (2013.01)

(58) Field of Classification Search
CPC ......... H01L 24/94; H01L 24/97; H01L 24/05; H01L 24/13; H01L 24/32; H01L 24/82; H01L 24/96; H01L 21/56; H01L 21/561; H01L 25/0652; H01L 25/0657; H01L 25/16; H01L 25/05; H01L 25/50; H01L 2224/05548; H01L 2224/05571; H01L 2224/06181; H01L 2224/13024; H01L 2224/16145; H01L 2224/19; H01L 2224/211; H01L 2224/215; H01L 2224/24; H01L 2224/24105; H01L 2224/24146; H01L 2224/32145; H01L 2224/73204; H01L 2224/73267; H01L 2224/9202; H01L 2224/92125; H01L 2224/92143; H01L 2224/94; H01L 2224/97; H01L 2224/0401; H01L 2224/95; H01L 2224/04105; H01L 2224/12105; H01L 2224/92244; H01L 2225/06524; H01L 2225/06513; H01L 2225/06517; H01L 2225/06568; H01L 23/49816; H01L 23/5389; H01L 2924/19104

See application file for complete search history.

(56) References Cited

U.S. PATENT DOCUMENTS

| | | | |
|---|---|---|---|
| 8,164,175 | B2 | 4/2012 | Moden |
| 8,592,252 | B2 | 11/2013 | Bathan et al. |
| 9,177,848 | B2 | 11/2015 | Do et al. |
| 9,330,994 | B2 | 5/2016 | Camacho et al. |
| 9,821,998 | B2 | 11/2017 | Gupta et al. |
| 9,841,341 | B2 | 12/2017 | Fontana et al. |
| 2008/0153204 | A1 | 6/2008 | Jackson et al. |
| 2012/0193781 | A1 | 8/2012 | Costa et al. |
| 2019/0115287 | A1* | 4/2019 | Derai ............... H01L 24/73 |
| 2021/0305203 | A1* | 9/2021 | Graziosi ........... H01L 24/85 |
| 2024/0332143 | A1* | 10/2024 | Luan ............... H01L 23/3107 |

OTHER PUBLICATIONS

Rovitto, M.: "1.3.2 Solder Bumps," Electromigration Reliability Issue in Interconnects for Three-Dimensional Integration Technologies, 2 pages, https://www.iue.tuwien.ac.at/phd/rovitto/node19.html.

Lavagno, Luciano, et al: "9.3 TSV Placement in Block-Level 3D ICs," Jul. 23, 2021, 1 page, https://books.google.com/books?id=_dsNDgAAQBAJ&pg=PT271&lpg=PT271&dq=9.3+tsv+placement+in+block-level+3d+ics&source=bl&ots=JEstCTsLWr&sig=ACfU3U1kvLhQENgFyhaRTfoSfDK29vdCNA&hl=en&sa=X&ved=2ahUKEwiAs_yhooHyAhWVZs0KHVn7CSIQ6AEwBXoECBAQAw#v=onepage&q=9.3%20tsv%20placement%20in%20block-level%203d%20ics&f=false.

* cited by examiner

LOW COST WAFER LEVEL PACKAGES AND SILICON

RELATED APPLICATION

This application claims priority to United States Provisional Application for Patent No. 63/203,539, filed Jul. 27, 2021, the contents of which are incorporated by reference in their entirety.

TECHNICAL FIELD

This disclosure is related to techniques for forming wafer-level packages and, in particular, to forming wafer-level packages having redistribution layers formed using laser direct structuring so as to enable the formation of compact packages containing multiple interconnected integrated circuit die.

BACKGROUND

Integrated circuit die are packaged to protect the die from operating environments and to provide an electrical interface between a die and an electronic device in which the die is utilized. Traditionally, die packaging techniques were distinct from semiconductor manufacturing techniques used in wafer level processing. Recently, however, wafer level processing techniques, such as wafer level chip scale packaging (WLCSP) have begun to be used in constructing the die packages.

Figure 1:
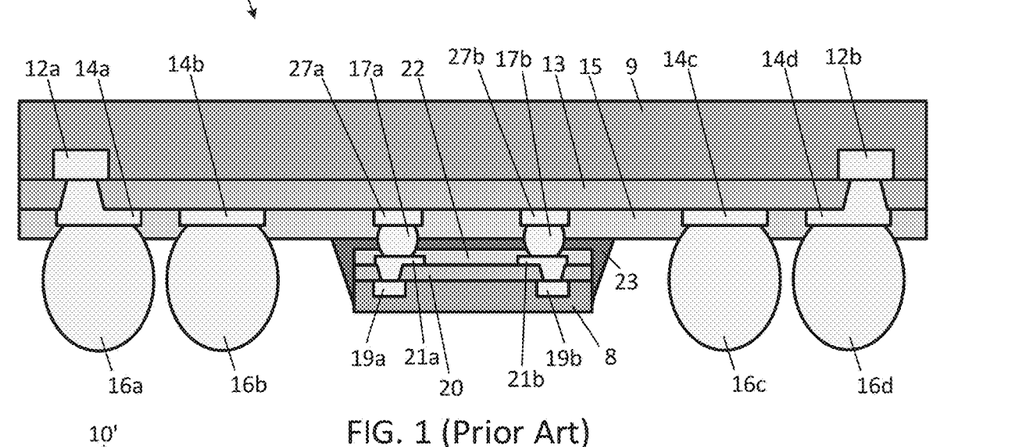
FIG. 1 is a cross sectional view of a wafer-level package formed using prior art techniques.

FIG. 1 is a cross-sectional view of a known package 10 that includes a first integrated circuit die 9 connected with a second integrated circuit die 8 through respective redistribution layers formed on the first integrated circuit die 9.

In greater detail, the first integrated circuit die 9 has a back side illustrated as being exposed, and a front side having pads 12a and 12b formed thereon, the pads 12a and 12b providing connection to internal circuits within the first integrated circuit die 9. A passivation layer 13 is disposed on the front side of the first integrated circuit die 9, and a solder resist layer 15 is formed on the passivation layer 13. A first redistribution layer formed within the passivation layer 13 and solder resist layer 15 includes interconnections 14a and 14d respectively connected to pads 12a and 12b, and interconnections 14b, 14c, 27a, and 27b connected to non-illustrated pads on the front side of the first integrated circuit die 9. Solder balls 16a-16d are respectively connected to interconnections 14a-14d.

The second integrated circuit die 8 has a back side illustrated as being encapsulated by encapsulation layer 23, and a front side having pads 19a and 19b formed thereon, the pads 19a and 19b providing connection to internal circuits within the second integrated circuit die 8. A passivation layer 20 is disposed on the front side of the second integrated circuit die 8, and a solder resist layer 22 is formed on the passivation layer 20. A second redistribution layer formed within the passivation layer 20 and the solder resist layer 22 includes interconnections 21a and 21b respectively connected to pads 19a and 19b. Solder balls 17a and 17b connect the interconnections 27a and 27b of the first integrated circuit die 9 to the interconnections 21a and 21b of the second integrated circuit die 8. Encapsulation layer 23 encapsulates the edge sides and front face of the second integrated circuit die 8 and seals it against the solder resist 15 of the first integrated circuit die 9.

Wafer level packages formed according to the wafer level processing techniques of the prior art such as in FIG. 1 have several limitations. For example, the cost of forming high density, large size, and high pin-count wafer-level packages may be higher than desirable, particularly when a fan-out arrangement is to be used. Moreover, wafer-level packages utilizing multiple integrated circuit die can be difficult to form, and the use of solder balls to connect the different die can consume an undesirable amount of space.

As such, further development is needed.

SUMMARY

Disclosed herein is a method of forming wafer-level packages from a wafer, including: adhesively attaching back sides of second integrated circuits to a front side of the wafer including a plurality of first integrated circuits such that pads on front sides of the first integrated circuits and pads on front sides of the second integrated circuits are exposed; forming a laser direct structuring (LDS) activatable layer over the front sides of the first integrated circuits and the second integrated circuits and over edges of the second integrated circuits; activating portions of the LDS activatable layer to form desired patterns of structured areas within the LDS activatable layer, some of the desired patterns of structured areas within the LDS activatable extending from the pads on the front sides of the second integrated circuits to the pads on the front sides of the first integrated circuits; metallizing the desired patterns of structured areas to form conductive areas within the LDS activatable layer, some of the formed conductive areas electrically connecting the pads of the first integrated circuits to the pads of the second integrated circuits; and singulating the wafer to thereby form a plurality of wafer-level packages, each wafer-level package containing one of the first integrated circuits and one of the second integrated circuits.

Solder balls may be attached to desired ones of the formed conductive areas such that some of the solder balls attached to formed conductive areas on the front side of the first integrated circuits are electrically connected to the pads on the front side of the second integrated circuits.

A coating may be formed on the back sides of the first integrated circuits prior to singulation.

A solder resist layer may be formed on the LDS activatable layer.

Passive components may be attached to desired ones of the conductive areas formed on the first integrated circuits that are electrically connected to desired pads on the front sides of the second integrated circuits, and forming molding layers over the passive components.

Molding layers may be formed over the first integrated circuits, forming pads on bottom sides of the molding layers, and vias may be formed in the molding layers that electrically connect desired ones of the conductive areas formed on the first integrated circuits that are electrically connected to pads on the front sides of the first integrated circuits to the pads formed on the bottom sides of the molding layers.

Molding layers may be formed over the first integrated circuits, pads may be formed on bottom sides of the molding layers, and interconnects may be formed that connect the pads on the bottom sides of the molding layers to desired pads on the front side of the second integrated circuits.

Chips may be attached to desired ones of the conductive areas formed on the first integrated circuits using solder balls, such that pads of the chips face the desired ones of those conductive areas, and forming molding layer over the chips.

Also disclosed herein is a wafer-level package, including: a first integrated circuit die having a plurality of pads on its front side; a second integrated circuit die having a plurality of pads on its front side, wherein an adhesive layer affixes a back side of the second integrated circuit die to the front side of the first integrated circuit die; a resin layer surrounding edge sides of the second integrated circuit die and the front side of the second integrated circuit die, and surrounding the front side of the first integrated circuit die, wherein the resin layer includes an activatable catalyst material; a solder resist layer having its back surface in contact with a front surface of the resin layer; and a redistribution layer. The redistribution layer includes: first activated and metallized portions of the resin layer adjacent the plurality of pads on the front side of the second integrated circuit die; second activated and metallized portions of the resin layer adjacent the plurality of pads on the front side of the first integrated circuit die; and third activated and metallized portions of the resin layer extending from given ones of the first activated and metallized portions of the resin layer, down the edge sides of the second integrated circuit die, and across portions of the resin layer on the front side of the first integrated circuit die, to thereby provide electrically connections between given ones of the plurality of pads on the front side of the second integrated circuit die to locations on the resin layer on the front side of the first integrated circuit die.

Fourth activated and metallized portions of the resin layer may electrically connect certain ones of the first activated and metallized portions of the resin layer to certain ones of the second activated and metallized portions of the resin layer to thereby electrically connect certain pads on the front side of the second integrated circuit die to certain pads on the front side of the first integrated circuit die.

A fourth activated and metallized portion of the resin layer may be on the front side of the first integrated circuit die. A fifth activated and metallized portion of the resin layer may electrically connect one of the first activated and metallized portions to the fourth activated and metallized portion of the resin layer.

A passive component may electrically connect to the fourth activated and metallized portion of the resin layer.

A molding layer may encapsulate the passive component.

A molding layer may encapsulate a portion of the first integrated circuit die and one of the second activated and metallized portions of the resin layer. A pad may be formed on the molding layer. A via may extend from the pad formed on the molding layer, through the molding layer, to contact the one of the second activated and metallized portions of the resin layer to thereby electrically connect the pad formed on the molding layer to the one of the second activated and metallized portions of the resin layer.

A chip may be connected to one of the third activated and metallized portions of the resin layer on the front side of the first integrated circuit die.

A molding layer may encapsulate the chip.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

In the following disclosure, references to elements being "connected" may indicate that those components are electrically connected, and may be directly electrically connected, as well as being physically connected.

Figure 2A:
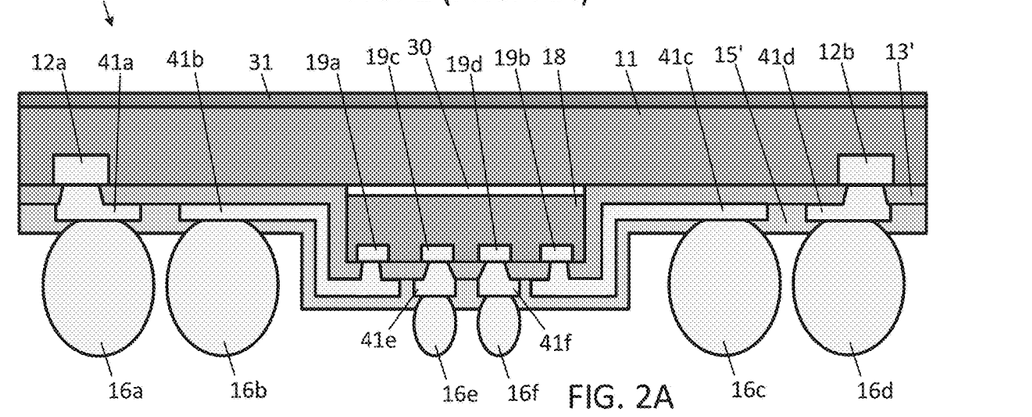
FIGS. 2A-2B are cross sectional views of a first wafer-level package formed using techniques described herein.

With initial reference to FIG. 2A, a first wafer level package 10' is now described. The first wafer level package 10' is comprised of a first integrated circuit die 11 having pads 12a and 12b on its front side and a coating 31 on its back side, and a second integrated circuit die 18 having pads 19a-19b on its front side and having its back side facing the front side of the first integrated circuit die 11. An adhesive layer 30 attaches the back side of the second integrated circuit die 18 to the front side of the first integrated circuit die 11. Therefore, notice that the pads 12a and 12b of the first integrated circuit die 11 do not face the pads 19a-19b of the second integrated circuit die 18.

A resin layer 13' is disposed on and across the front side of the front integrated circuit die 11, on and up the edge sides of the second integrated circuit die 18, and on and across the front side of the second integrated circuit die 18. A solder resist layer 15' is disposed on and across the resin layer 13'.

Figure 2B:
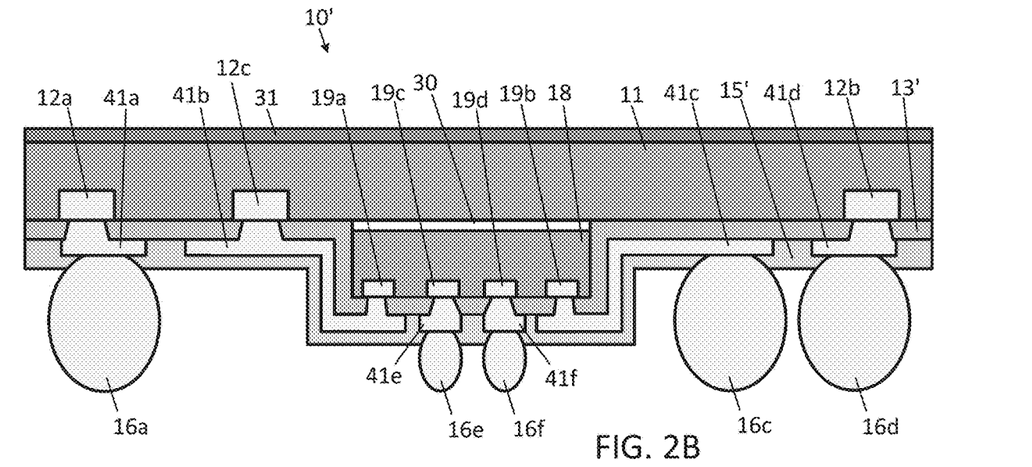

A redistribution layer (RDL) is formed within and on the resin layer 13' and covered by the solder resist layer 15'. The RDL includes interconnections 41a and 41d respectively connected to the pads 12a and 12b and interconnections 41e and 41f respectively connected to the pads 19c and 19d. The RDL also includes interconnections 41b and 41c extending from the pads 19a and 19b, across the portion of the resin layer 13' on the front of the second die 18, down the portions of the resin layer 13' on the edge sides of the second die 18, and across the portions of the resin layer 13' on the front of the integrated circuit die 11. In some instances, interconnections 41b or 41c may connect pads 19a or 19c to respective pads on the first integrated circuit die 11, for example shown in FIG. 2B where interconnection 41b connects pad 19a to a pad 12c on the first integrated circuit die 11.

Solder balls 16a and 16d are respectively connected to the interconnections 41a and 41d. Solder balls 16b and 16c are respectively connected to the portions of the interconnections 41b and 41c extending across the resin layer 13' on the front of the first integrated circuit die 11. Solder balls 16e and 16f are respectively connected to the interconnections 41e and 41f.

Of note here is that the interconnections 41a-41f are not formed by conventional techniques. As will be explained below in detail, the interconnections 41a-41f are formed by activating desired areas of the resin layer 13' (and drilling appropriate areas prior to activation of the desired areas and the walls of the holes formed via drilling), which contains an activatable catalyst, and then plating the activated areas.

Formation of the first wafer level package 10' is now described with reference to the series of drawing FIGS. 3-11.

Figure 3:
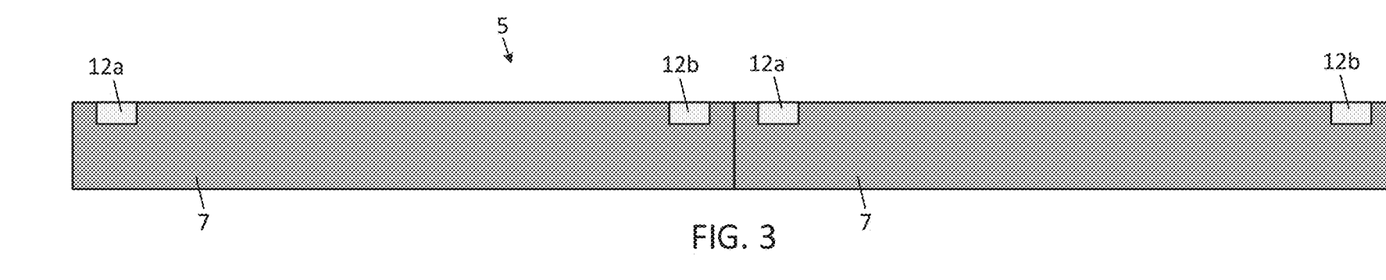
FIGS. 3-11 illustrate the series of steps involved in fabricating the first wafer-level package of FIG. 2A.

Referring first to FIG. 3, a single incoming wafer 5 has integrated circuit die locations 7 formed therein; two such integrated circuit die locations 7 are shown, but it should be understood that any number of such integrated circuit die locations 7 may be present. Each integrated circuit die location 7 has pads 12a and 12b formed on its front side.

Figure 4:
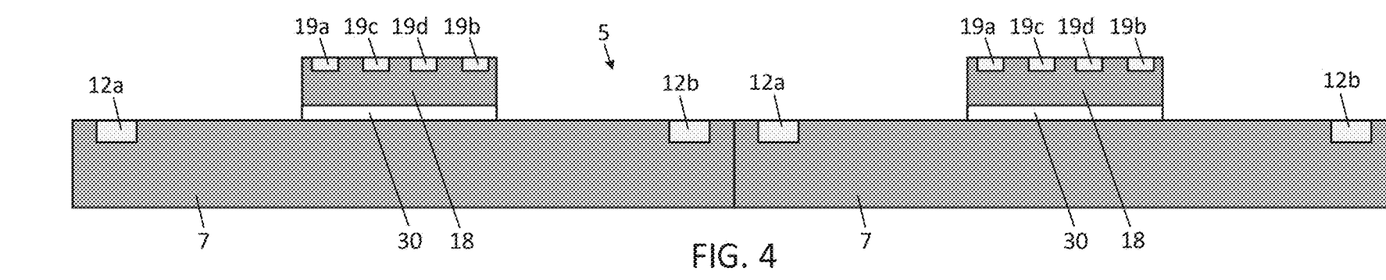

Adhesive layers 30 are formed on the front side of each integrated circuit die location 7, as shown in FIG. 4, and then the back sides of integrated circuits 18 are attached to the adhesive layers 30, such that the back sides of integrated circuits 18 are attached to the front sides of the integrated circuit die locations 7. The integrated circuits 18 each have pads 19a-19d formed on their front sides.

Figure 5:
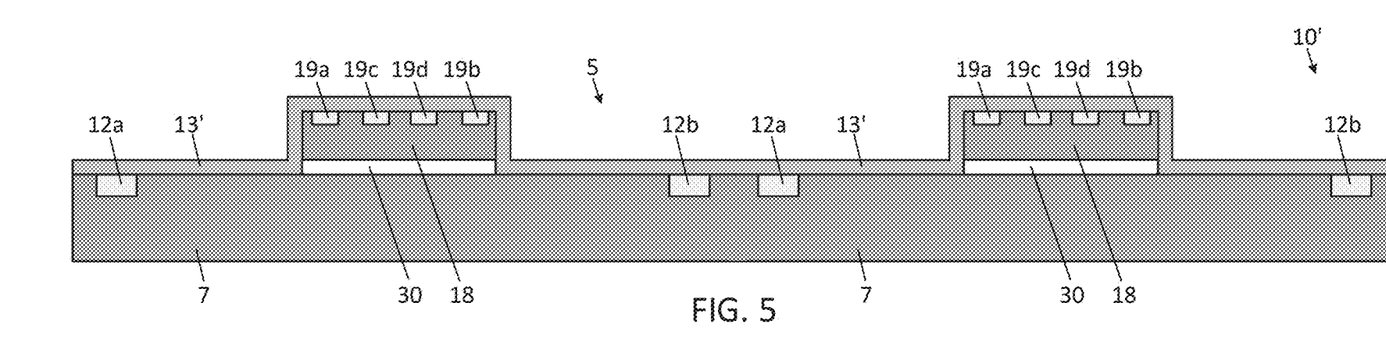

A conformal deposit, for example, by spraying, is made of a layer of laser direct structuring (LDS) comparable resin 13' on the combined structures of the integrated circuit die locations 7 and integrated circuit dice 18', as shown in FIG. 5. In particular, the LDS compatible resin 13' is sprayed on the exposed portions of the front sides of the integrated circuit die locations 7 and integrated circuit dice 18, and on the sides of the integrated circuits 18. The LDS compatible resin is infused or implanted with a laser-activated catalyst or particles that, when subjected to certain laser radiation, such as infrared (IR) laser radiation, become activated or exposed to form structured areas. These structured areas may then be turned into conductive areas via metallization.

For example, the LDS resin layer 13' may have particles such as copper-chromium oxide spinel, copper sulfate, copper hydroxide phosphate, or cupric rhodanate embedded therein. The molding layer 13' is then cured.

Figure 6:
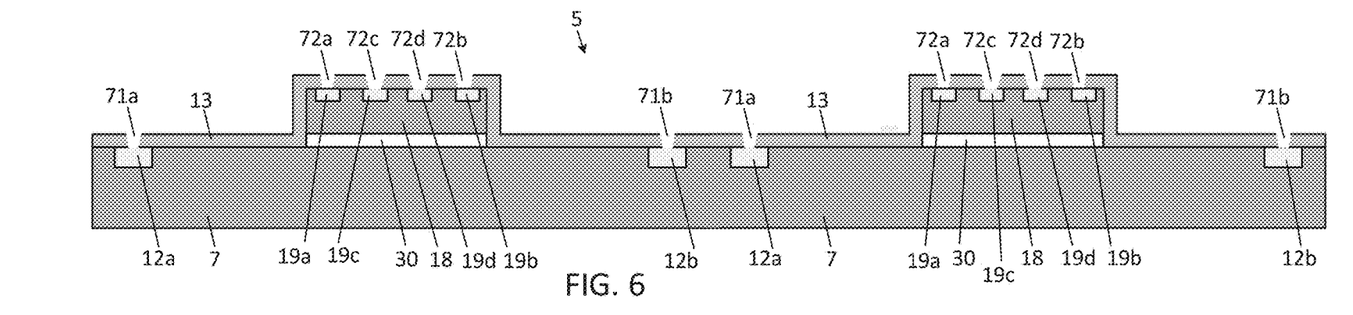

Next, as shown in FIG. 6, via cavities 71a-71b and 72a-72d through the LDS resin layer 13' are formed by laser drilling, and a laser light is used to form a desired pattern of structured areas in the LDS resin layer 13' by activating or exposing the catalyst in the walls of the via cavities 71a-71b and 72a-72d.

By structured area, it is meant an area in the LDS resin layer 13' where the catalyst has been activated or exposed due to application of a laser light to the relevant portion of the LDS resin layer 13'. As will be explained below, structured areas can be metallized to form conductive areas. For example, laser activation can be applied to the walls of the via cavities 71a-71b and 72a-72d to structure those walls.

Figure 7:
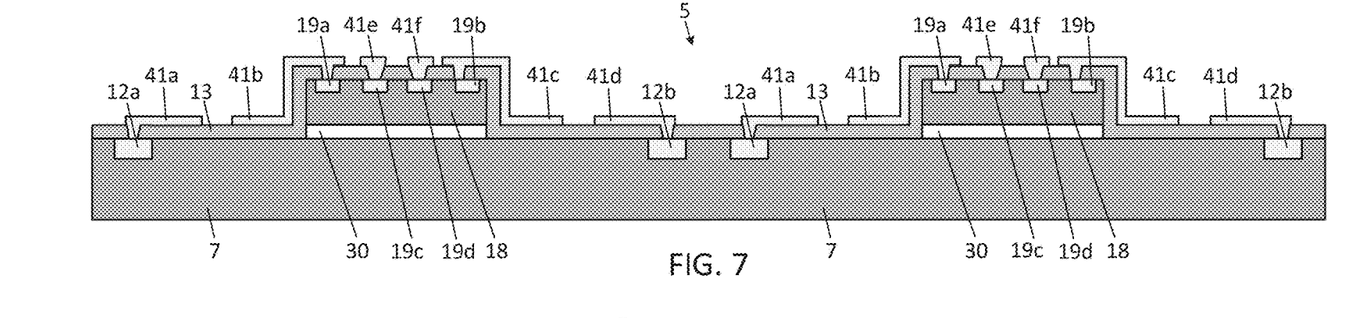

Thereafter, as shown in FIG. 7, a metallization process is performed to metallize the via cavities 71a-71b and 72a-72d and form traces connected to them and extending across the LDS resin layer 13', thereby forming the interconnections 41a-41f. This metallization process may include a copper electroless deposition, where an appropriate wet chemical bath reacts with exposed chromium particles within the LDS resin layer 13' to create a thin (e.g., 5 μm in thickness) copper pattern on the patterns of structured areas on the LDS resin layer 13'. This thin copper pattern can be thickened through electrodeposition to reach a desired thickness (e.g., 10 μm) that properly forms the interconnections 41a-41f.

Figure 8:
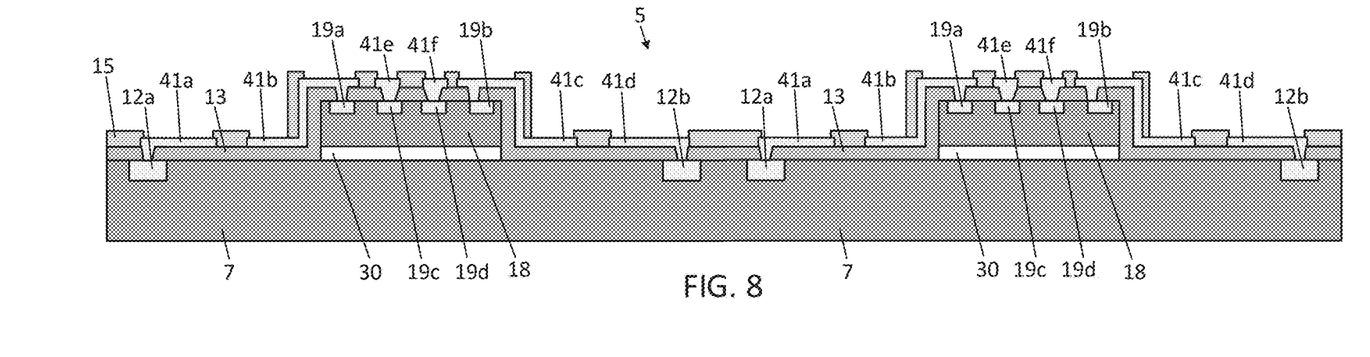
Figure 9:
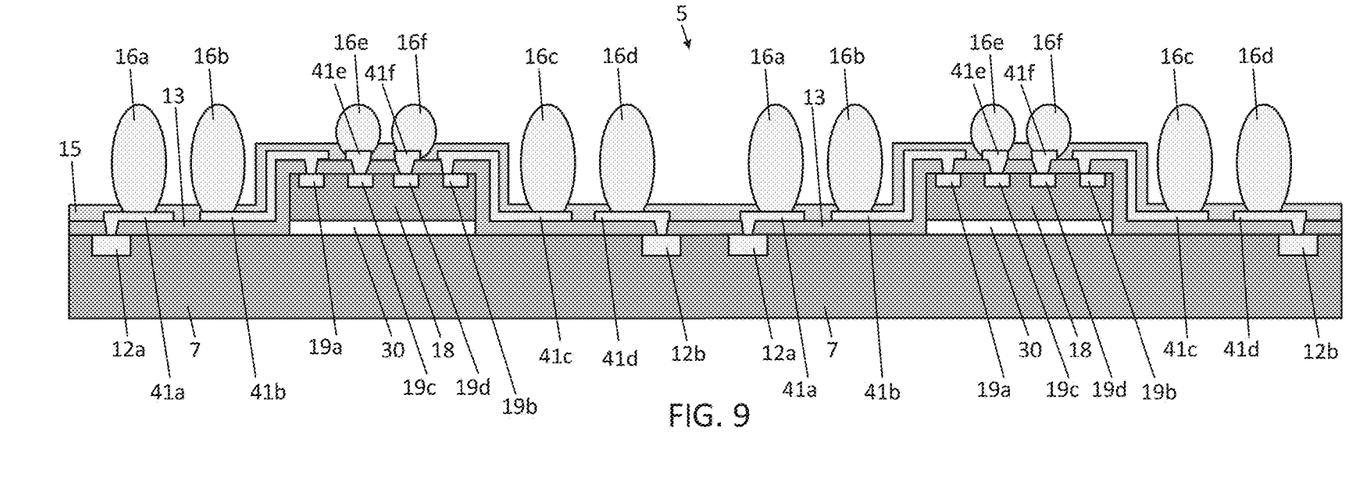
Figure 10:
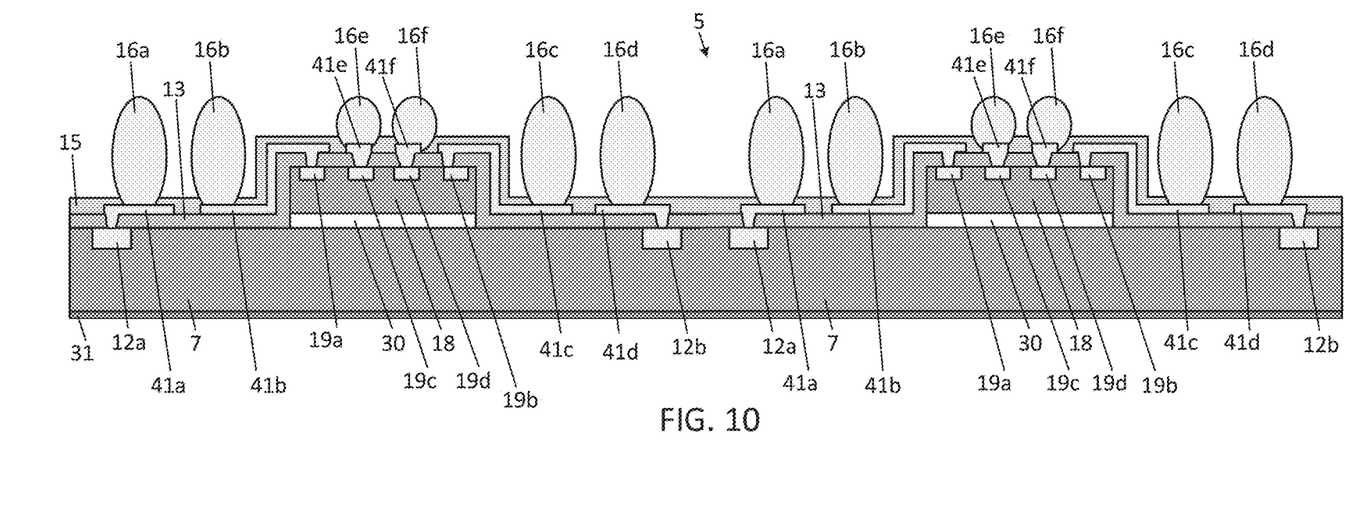
Figure 11:
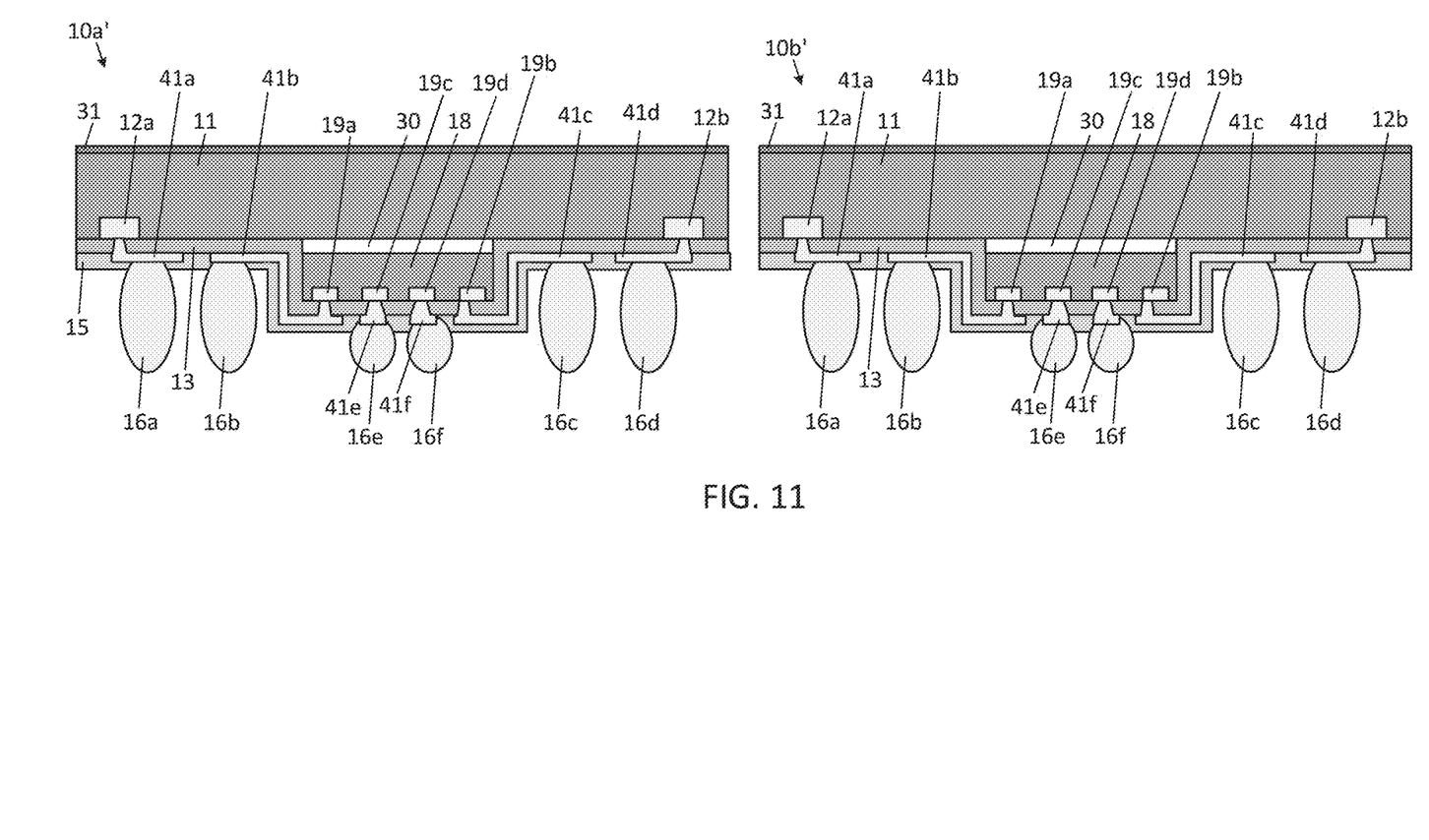

Next, as shown in FIG. 8, a solder resist layer 15 is formed over the LDS resin layer 13' and interconnections 41a-41f. Then, solder balls 16a-16d are connected to the interconnections 41a-41d, and solder balls 16e-16f are connected to the interconnections 41e-41f, as shown in FIG. 9. A coating 31 is then applied to the back side of the integrated circuit die locations 7, as shown in FIG. 10, and then the wafer is singulated into integrated circuit dice 11 to form wafer-level packages 10a' and 10b', as shown in FIG. 11.

Figure 12:
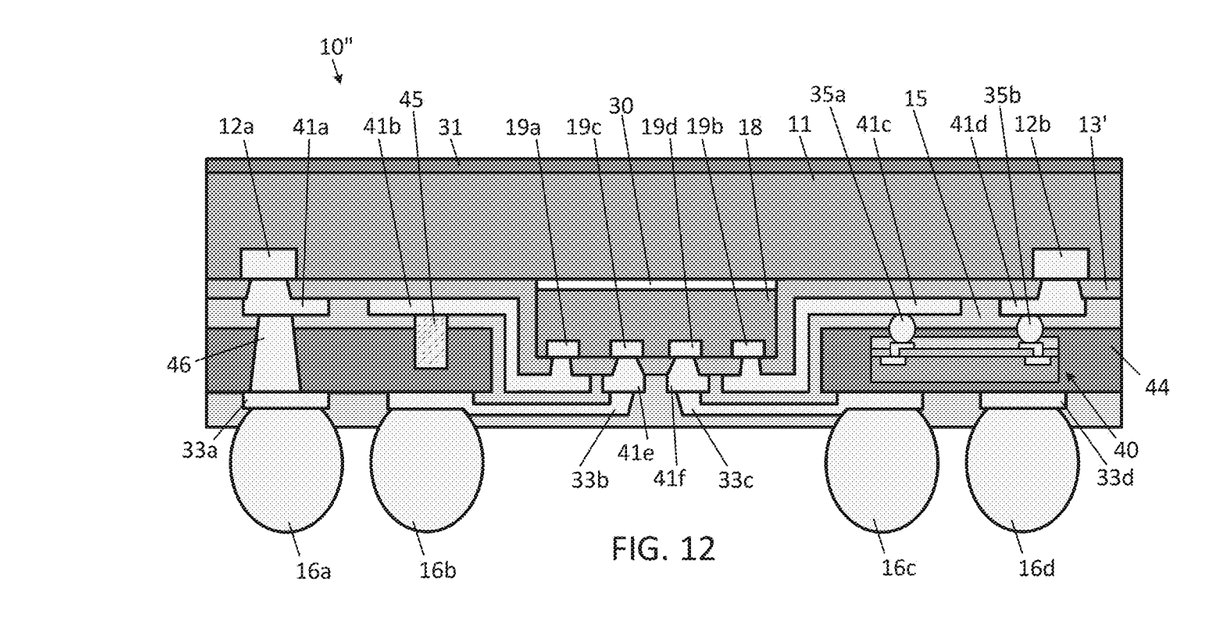
FIG. 12 is a cross sectional view of a second wafer-level package formed using techniques described herein.

With initial reference to FIG. 12, a second wafer level package 10" is now described. The second wafer level package 10" is comprised of a first integrated circuit die 11 having pads 12a and 12b on its front side and a coating 31 on its back side, and a second integrated circuit die 18 having pads 19a-19b on its front side and having its back side facing the front side of the first integrated circuit die 11. An adhesive layer 30 attaches the back side of the second integrated circuit die 18 to the front side of the first integrated circuit die 11. Therefore, notice that the pads 12a and 12b of the first integrated circuit die 11 do not face the pads 19a-19b of the second integrated circuit die 18.

A resin layer 13' is disposed on and across the front side of the front integrated circuit die 11, on and up the edge sides of the second integrated circuit die 18, and on and across the front side of the second integrated circuit die 18. A solder resist layer 15' is disposed on and across the resin layer 13'.

A redistribution layer (RDL) is formed within and on the resin layer 13' and covered by the solder resist layer 15'. The RDL includes interconnections 41a and 41d respectively connected to the pads 12a and 12b, and interconnections 41e and 41f respectively connected to the pads 19c and 19d. The RDL includes interconnections 41b and 41c extending from the pads 19a and 19b, across the portion of the resin layer 13' on the front of the second die 18, down the portions of the resin layer 13' on the edge sides of the second die 18, and across the portions of the resin layer 13' on the front of the integrated circuit die 11.

Solder balls 35a and 35b are connected to the interconnections 41c and 41d, and to pads on a chip 40 having its front side facing the front side of the first integrated circuit die 11. A molding layer 44 encapsulates the chip 40, and extends along one side of the second integrated circuit die 18 and across a portion of the front face of the first integrated circuit die 15.

A passive component 45, such as a capacitor, is connected to the interconnection 41b. A via 46 is connected to the interconnection 41a. The molding layer 44 encapsulates the passive component 45, and extends along the other side of the second integrated circuit die 18 and across another portion of the front face of the first integrated circuit die 11.

Notice that the solder resist 14 also extends across the molding layer 44 and sandwiches the molding layer 44 on both of its sides. A pad 33a is in the solder resist 14 in the illustrated position opposite the interconnect 41a and is connected to the via 46, and a solder ball 16a is connected to the pad 33a. A pad and interconnect 33b extends in the solder resist 14 from the interconnect 41e to the illustrated position opposite the passive component 45 and interconnect 41b, and a solder ball 16b is connected to the pad 33b. A pad and interconnect 33c extends in the solder resist 14 from the interconnect 41f to the illustrated position opposite the chip 40 and interconnect 41c, and a solder ball 16c is connected to the pad 33c. A pad 33d is in the solder resist 14 opposite the interconnect 41d, and a solder ball 16d is connected to the pad 33d.

Of note here is that the interconnections 41a-41f are not formed by drilling and filling. The interconnections 41a-41f are formed by activating desired areas of the resin layer 13' (and drilling appropriate areas prior to activation of the desired areas and the walls of the holes formed via drilling), which contains an activatable catalyst, and then plating the activated areas. Also of note is that the pads 33a, pads and interconnects 33b, pads and interconnects 33c, and pads 33d within the solder resist 15, as well as the vias 46, are formed by conventional techniques and not using LDS techniques.

Figure 13:
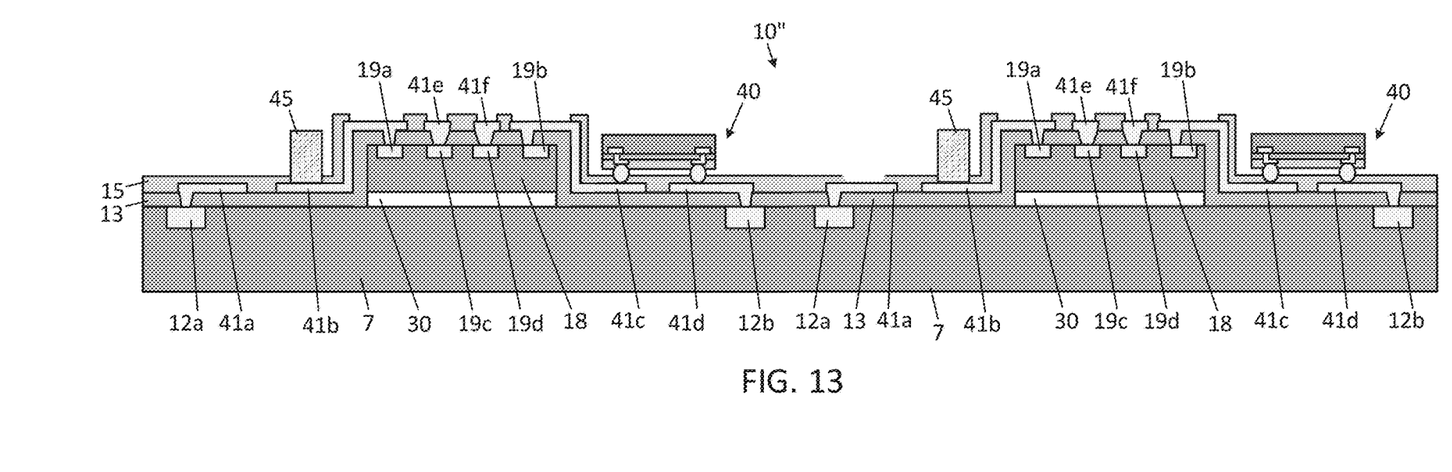
FIGS. 13-19 illustrate the series of steps involved in fabricating the second wafer-level package of FIG. 12.

Formation begins of the second wafer level package 10" begins the same as the first wafer level package 10', as described above with reference to FIGS. 3-8. The remainder of the formation of the second wafer level package 10" is now described with additional reference to drawing FIGS. 13-19. After forming of the solder resist layer 16 over the LDS resin layer 13' and interconnections 41a-41f, passive components 45 are attached to the interconnections 41b, as shown in FIG. 13. Additionally, chips 40 are attached to interconnections 41c and 41d at this point.

Figure 14:
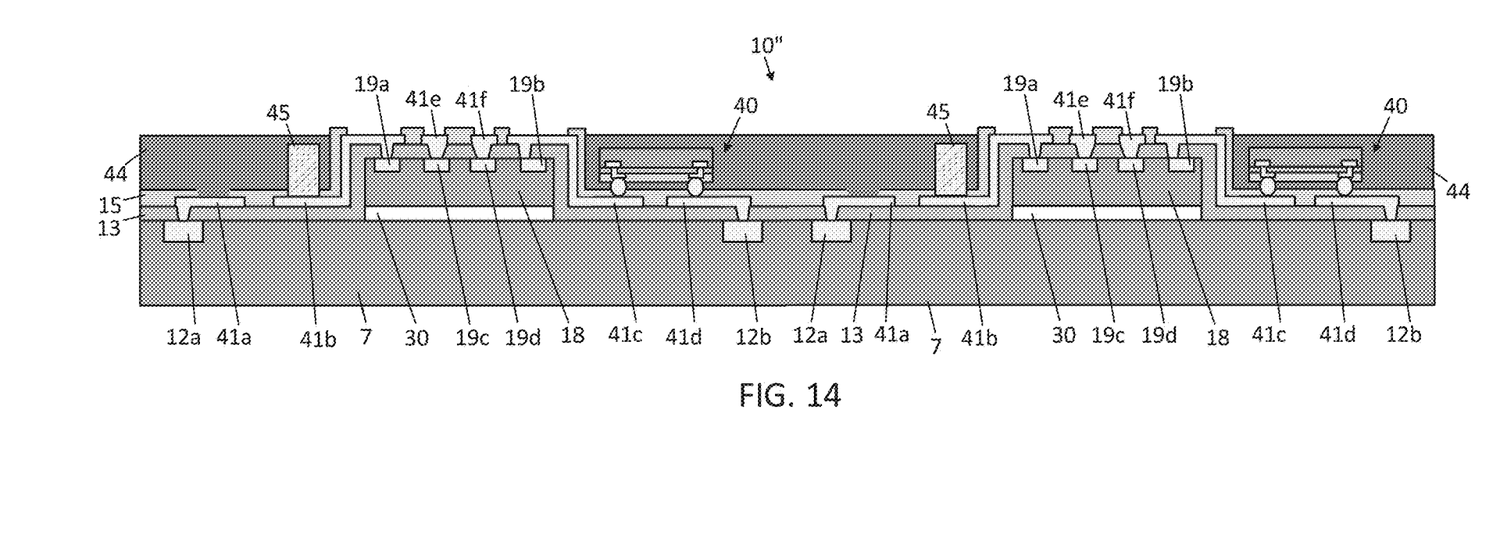
Figure 15:
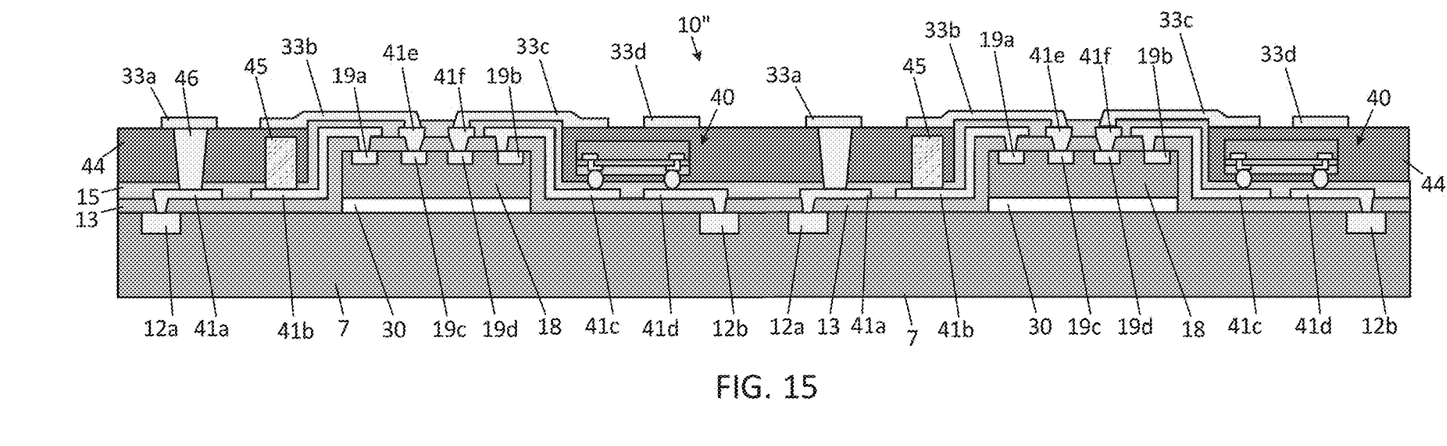

Next, as shown in FIG. 14, a molding layer 44 is deposited over the solder resist 15, passive components 45, and chips 40. Then, as shown in FIG. 15, vias 46 are formed in the molding layer 44 using conventional techniques, extending from a front face of the molding layer 44 to reach the interconnections 41a.

Pads 33a are formed in the solder resist 14 in the illustrated positions opposite the interconnects 41a and are connected to the vias 46, and solder balls 16a are connected to the pads 33a, using conventional techniques.

Pads and interconnects 33b are formed to extend in the solder resist 14 from the interconnects 41e to the illustrated positions opposite the passive components 45 and interconnects 41b, and solder balls 16b are connected to the pads 33b, using conventional techniques. Pads and interconnects 33c are formed to extend in the solder resist 14 from the interconnects 41f to the illustrated position opposite the chips 40 and interconnects 41c, and solder balls 16c are connected to the pads 33c, using conventional techniques. Pads 33d are formed in the solder resist 14 opposite the interconnects 41d, and solder balls 16d are connected to the pads 33d, also using conventional techniques.

Figure 16:
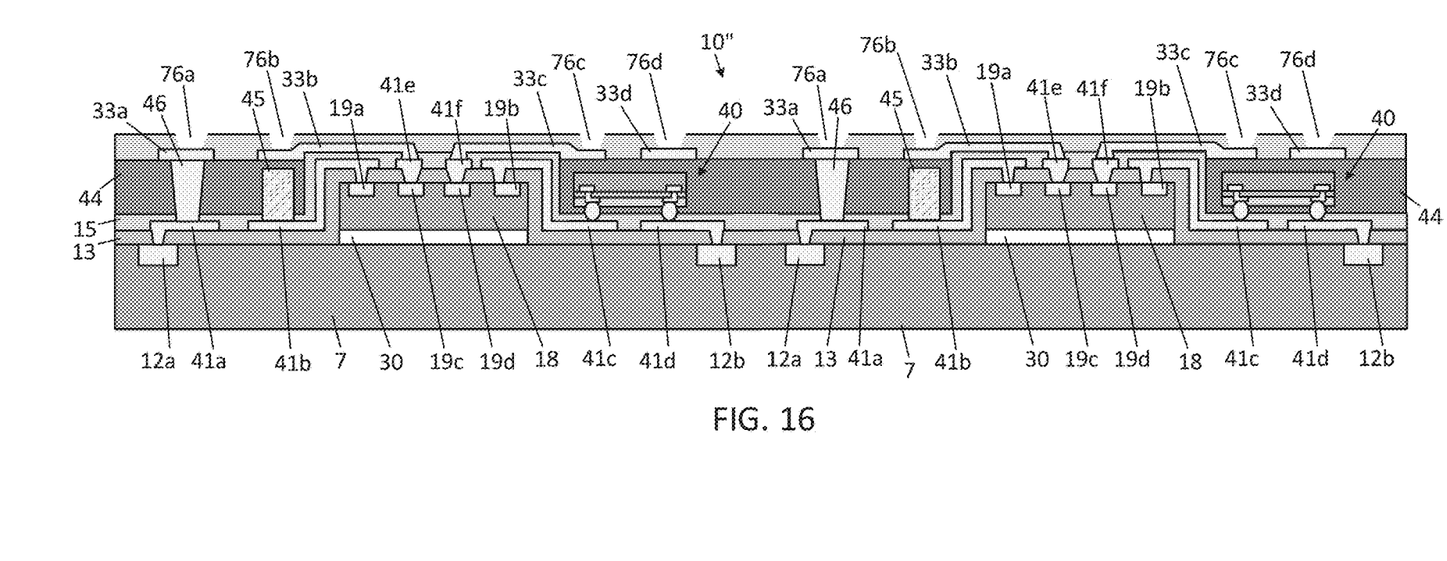
Figure 17:
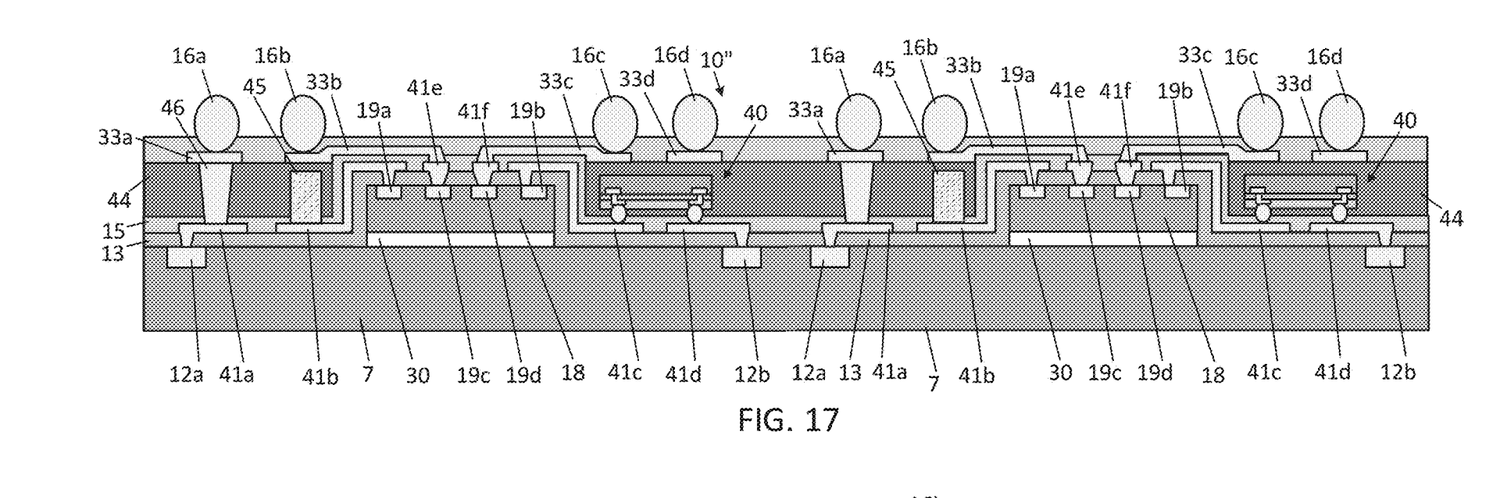
Figure 18:
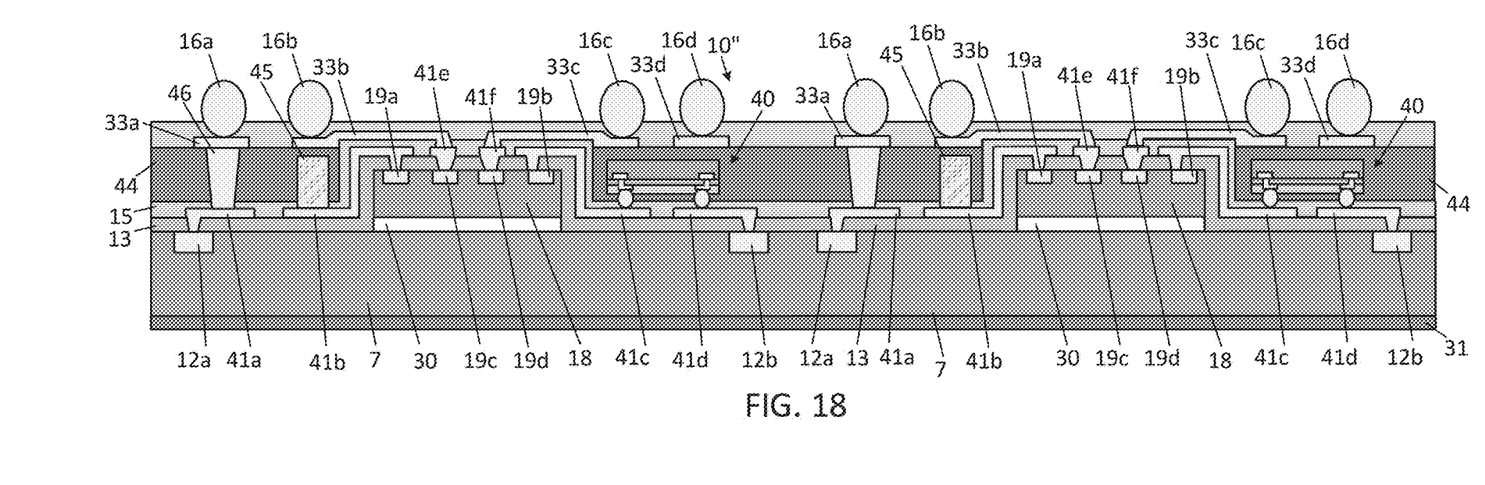
Figure 19:
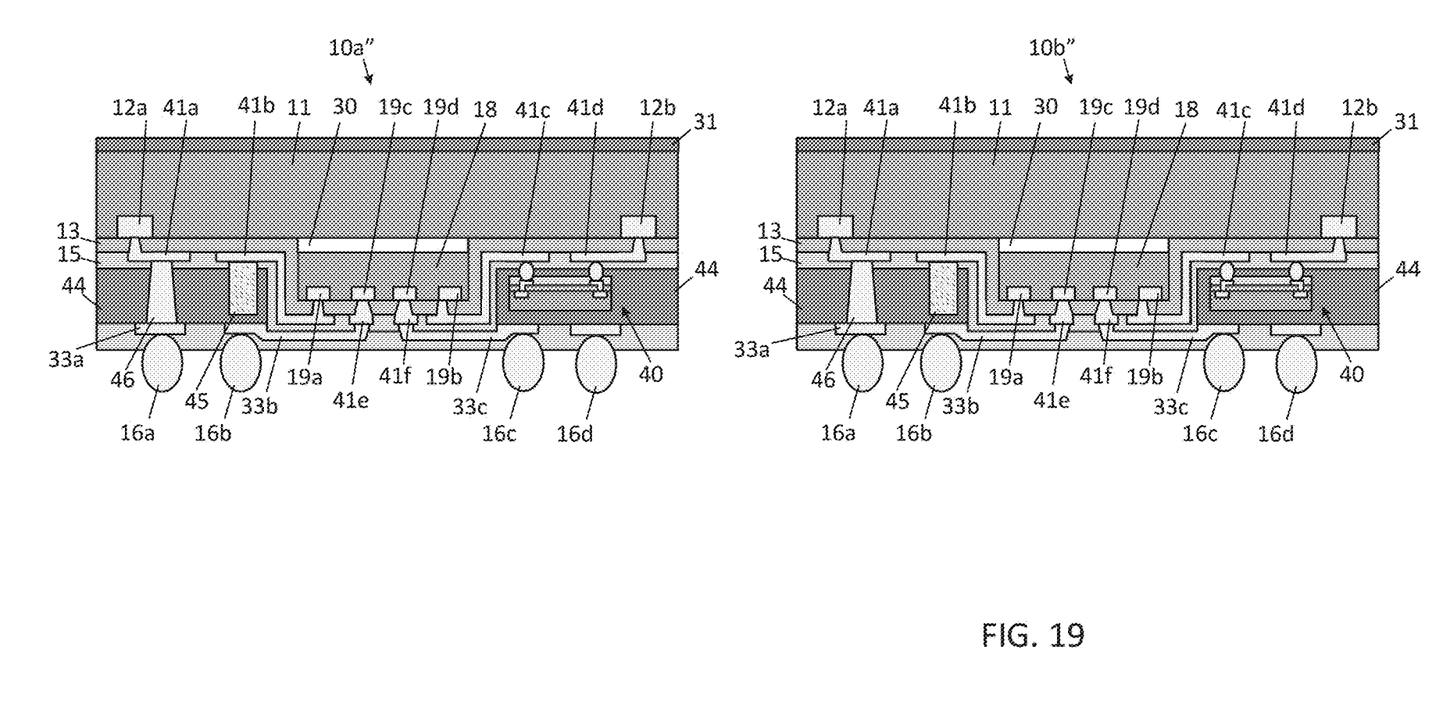

Then, as shown in FIG. 16, an additional portion of the solder resist 15 is formed over the molding layer 44, and holes 76a-76d are drilled in the molding layer 44. Thereafter, solder balls 16a-16d are connected to the pads and interconnects 33a-33d, as shown in FIG. 17, and a coating 31 is applied to the back side of the integrated circuit die locations 7, as shown in FIG. 18, and then the integrated circuits are singulated into integrated circuit die 10a" and 10b", as shown in FIG. 19.

Figure 20:
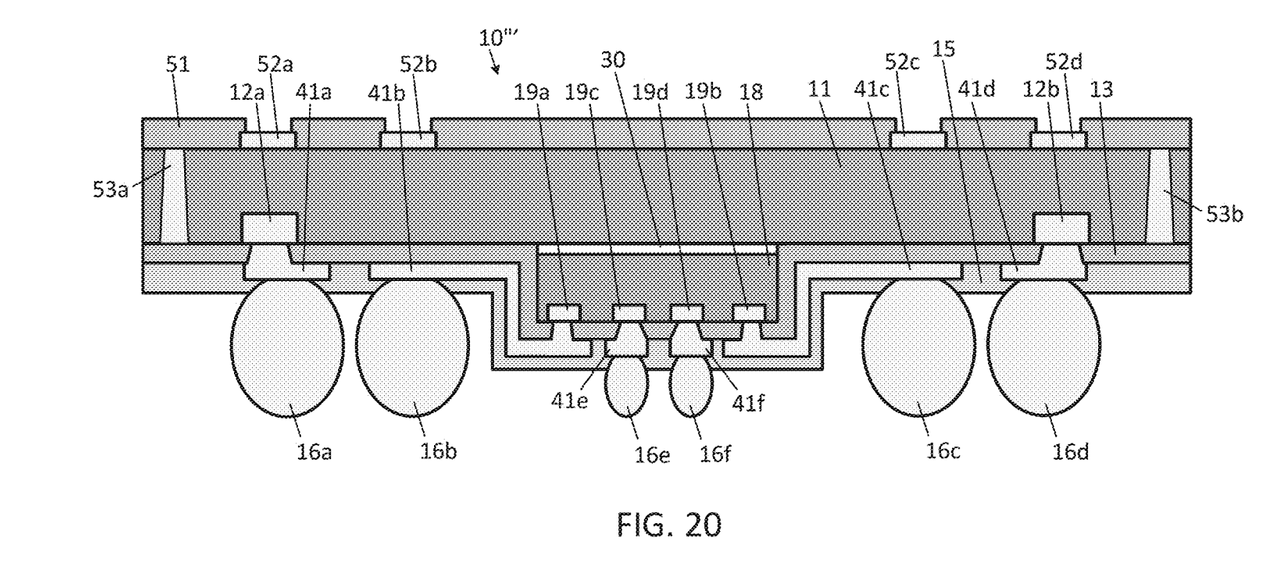
FIG. 20 is a cross sectional view of a third wafer-level package formed using techniques described herein.

Understand that the embodiments given above are examples of the possibilities possible when using LDS techniques. Another example is shown in the package 10''' of FIG. 20, which is the same as the package 10' as in FIG. 2A, except here another solder resist layer 51 is deposited on the back side of the integrated circuit die locations 7, and pads 52a-52d are formed thereon. Connectors 53a and 53b extent through the integrated circuit die locations 7 to provide interconnection between components in the solder resist layers 51 and 13.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of forming wafer-level packages from a wafer, comprising:
adhesively attaching back sides of second integrated circuits to a front side of the wafer including a plurality of first integrated circuits such that pads on front sides of the first integrated circuits and pads on front sides of the second integrated circuits are exposed;
forming a laser direct structuring (LDS) activatable layer over the front sides of the first integrated circuits and the second integrated circuits and over edges of the second integrated circuits;
activating portions of the LDS activatable layer to form desired patterns of structured areas within the LDS activatable layer, some of the desired patterns of structured areas within the LDS activatable layer extending from the pads on the front sides of the second integrated circuits to the pads on the front sides of the first integrated circuits;
metallizing the desired patterns of structured areas to form conductive areas within the LDS activatable layer, some of the formed conductive areas electrically connecting the pads of the first integrated circuits to the pads of the second integrated circuits; and
singulating the wafer to thereby form a plurality of wafer-level packages, each wafer-level package containing one of the first integrated circuits and one of the second integrated circuits.

2. The method of claim 1, further comprising attaching solder balls to desired ones of the formed conductive areas such that some of the solder balls attached to the desired ones of the formed conductive areas on the front side of the first integrated circuits are electrically connected to the pads on the front side of the second integrated circuits.

3. The method of claim 1, further comprising forming a coating on back sides of the first integrated circuits prior to singulation.

4. The method of claim 1, further comprising forming a solder resist layer on the LDS activatable layer.

5. The method of claim 1, further comprising attaching passive components to desired ones of the conductive areas formed on the first integrated circuits that are electrically connected to desired pads on the front sides of the second integrated circuits, and forming molding layers over the passive components.

6. The method of claim 1, further comprising forming molding layers over the first integrated circuits, forming pads on bottom sides of the molding layers, and forming vias in the molding layers that electrically connect desired ones of the conductive areas formed on the first integrated circuits that are electrically connected to pads on the front sides of the first integrated circuits to the pads formed on the bottom sides of the molding layers.

7. The method of claim 1, further comprising forming molding layers over the first integrated circuits, forming pads on bottom sides of the molding layers, and forming interconnects that connect the pads on the bottom sides of the molding layers to desired pads on the front side of the second integrated circuits.

8. The method of claim 1, further comprising attaching chips to desired ones of the conductive areas formed on the first integrated circuits using solder balls, such that pads of the chips face the desired ones of those conductive areas, and forming molding layer over the chips.

9. The method of claim 1, wherein forming the LDS activatable layer comprises spraying a resin containing at least one laser-activated catalyst selected from a group consisting of copper-chromium oxide spinel, copper sulfate, copper hydroxide phosphate, and cupric rhodanate.

10. The method of claim 9, wherein activating portions of the LDS activatable layer comprises laser drilling via cavities through the LDS activatable layer to expose the pads on the front sides of the first integrated circuits and the pads on the front sides of the second integrated circuits, and applying laser light to activate the laser-activated catalyst in walls of the via cavities.

11. The method of claim 1, wherein metallizing comprises performing copper electroless deposition to form an initial copper pattern on the structured areas, and electrodepositing additional copper to thicken the initial copper pattern.

12. The method of claim 1, wherein forming conductive areas comprises forming interconnections having a thickness of approximately 10 µm.

13. The method of claim 1, further comprising forming a first solder resist layer on the LDS activatable layer, forming a second solder resist layer on back sides of the first integrated circuits, forming pads on the second solder resist layer, and forming connectors through the first integrated circuits to provide interconnection between the pads on the second solder resist layer and conductive areas in the LDS activatable layer.

14. A method comprising:
affixing back sides of second integrated circuits to a front side of a wafer including a plurality of first integrated circuits such that pads on front sides of the first integrated circuits and pads on front sides of the second integrated circuits are exposed;
forming a laser direct structuring (LDS) activatable layer over the front sides of the first integrated circuits and the second integrated circuits and over edges of the second integrated circuits;
forming desired patterns of structured areas within the LDS activatable layer, some of the desired patterns of structured areas within the LDS activatable layer extending from the pads on the front sides of the second integrated circuits to the pads on the front sides of the first integrated circuits; and
metallizing the desired patterns of structured areas to form conductive areas within the LDS activatable layer that electrically connect the pads of the first integrated circuits to the pads of the second integrated circuits.

15. The method of claim 14, further comprising attaching solder balls to desired ones of the formed conductive areas such that some of the solder balls attached to formed conductive areas on the front side of the first integrated circuits are electrically connected to the pads on the front side of the second integrated circuits.

16. The method of claim 14, further comprising attaching passive components to desired ones of the conductive areas formed on the first integrated circuits that are electrically connected to desired pads on the front sides of the second integrated circuits, and forming molding layers over the passive components.

17. The method of claim 14, further comprising forming molding layers over the first integrated circuits, forming pads on bottom sides of the molding layers, and forming vias in the molding layers that electrically connect desired ones of the conductive areas formed on the first integrated circuits that are electrically connected to pads on the front sides of the first integrated circuits to the pads formed on the bottom sides of the molding layers.

18. The method of claim 14, further comprising attaching chips to desired ones of the conductive areas formed on the first integrated circuits using solder balls, such that pads of the chips are positioned to face the desired ones of those conductive areas, and forming molding layer over the chips.

19. The method of claim 14, wherein forming the LDS activatable layer comprises spraying a resin containing at least one laser-activated catalyst selected from a group consisting of: copper-chromium oxide spinel, copper sulfate, copper hydroxide phosphate, and cupric rhodanate.

20. The method of claim 19, wherein forming desired patterns comprises laser drilling via cavities through the LDS activatable layer to expose the pads on the front sides of the first integrated circuits and the pads on the front sides of the second integrated circuits, and applying laser light to activate the laser-activated catalyst in walls of the via cavities.

21. The method of claim 14, wherein metallizing comprises performing copper electroless deposition to form a copper pattern having a thickness of approximately 5 µm, and electrodepositing additional copper to achieve a final thickness of approximately 10 µm.

* * * * *